(12) United States Patent
Ning et al.

(10) Patent No.: US 6,794,262 B2
(45) Date of Patent: Sep. 21, 2004

(54) MIM CAPACITOR STRUCTURES AND FABRICATION METHODS IN DUAL-DAMASCENE STRUCTURES

(75) Inventors: Xian J. Ning, Mohegan Lake, NY (US); Keith Kwong Hon Wong, Wappingers Falls, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 19 days.

(21) Appl. No.: 10/252,476

(22) Filed: Sep. 23, 2002

(65) Prior Publication Data

US 2004/0056324 A1 Mar. 25, 2004

(51) Int. Cl.[7] .............................................. H01L 21/20
(52) U.S. Cl. ...................... 438/396; 438/638; 438/666; 438/668; 438/702; 438/734
(58) Field of Search ................................. 438/239, 253, 438/396, 637, 638, 666, 668, 700, 702, 734

(56) References Cited

U.S. PATENT DOCUMENTS 4,579,812 A * 4/1986 Bower ......................... 438/702

2002/0185671 A1 * 12/2002 Kim ............................ 438/637

OTHER PUBLICATIONS

K.K.H. Wong, et al., "Metallization by plating for high–performance multichip modules," IBM J. Res. Develop., vol. 42, No. 5, pp. 587–596, Sep. 1998.

* cited by examiner

Primary Examiner—Mary Wilczewski
Assistant Examiner—Toniae M. Thomas
(74) Attorney, Agent, or Firm—Slater & Matsil, L.L.P.

(57) ABSTRACT

A metal-insulator-metal (MIM) capacitor (242/252) structure and method of forming the same. A dielectric layer (214) of a semiconductor device (200) is patterned with a dual damascene pattern having a first pattern (216) and a second pattern (218). The second pattern (218) has a greater depth than the first pattern (216). A conductive layer (226) is formed over the dielectric layer (214) in the first pattern, and a conductive layer is formed over the conductive layer in the first pattern (216). A dielectric layer (232), conductive layer (234), dielectric layer (236) and conductive layer (238) are disposed over the conductive layer (226) of the second pattern (218). Conductive layer (234), dielectric layer (232) and conductive layer (226) form a first MIM capacitor (252). Conductive layer (238), dielectric layer (236) and conductive layer (234) form a second MIM capacitor (242) parallel to the first MIM capacitor (242).

32 Claims, 6 Drawing Sheets

MIM CAPACITOR STRUCTURES AND FABRICATION METHODS IN DUAL-DAMASCENE STRUCTURES

TECHNICAL FIELD

Embodiments of the present invention relate generally to the fabrication of semiconductor devices, and more particularly to metal-insulator-metal capacitors (MIM capacitors).

BACKGROUND OF THE INVENTION

Semiconductors are used in integrated circuits for electronic applications, including radios, televisions, cell phones, and personal computing devices, as examples. Integrated circuits typically include multiple transistors fabricated in single crystal silicon. It is common for there to be millions of semiconductor devices on a single semiconductor product. Many integrated circuits now include multiple levels of metallization for interconnections.

Capacitors are elements that are used extensively in semiconductor devices for storing an electrical charge. Capacitors essentially comprise two conductive plates separated by an insulator. The capacitance, or amount of charge held by the capacitor per applied voltage, is measured in farads and depends upon a number of parameters such as the area of the plates, the distance between the plates, and the dielectric constant value for the insulator between the plates, as examples. Capacitors are used in filters, analog-to-digital converters, memory devices, control applications, and many other types of semiconductor devices.

One type of capacitor is a metal-insulator-metal capacitor (MIM capacitor), which is used often in mixed signal devices and logic devices, for example. MIM capacitors are used to store a charge in a variety of semiconductors. MIM capacitors typically require a much lower capacitance than deep trench memory capacitors, for example. A MIM capacitor may have a capacitance requirement of 1 $fF/micrometer^2$, for example. A MIM capacitor is typically formed horizontally on a semiconductor wafer, with two metal plates sandwiching a dielectric parallel to the wafer surface. At least one of the metal plates is usually formed in a metallization layer (metal interconnect layer) of the device. MIM capacitors embedded in the back-end-of-line (BEOL) structures have been used in many very large scale integrated logic (VLSI) devices in the past.

Horizontal MIM capacitors are manufactured in the BEOL, a stage in semiconductor device fabrication that usually begins with the formation of the first metallization layer on the wafer. MIM capacitors are typically formed in the BEOL by forming a bottom capacitive plate in a first or subsequently deposited horizontal metallization layer of a semiconductor wafer using a first lithography mask. A first etch step such as a reactive ion etch (RIE) is used to transfer the mask pattern to the bottom plate. A capacitor dielectric is deposited over the bottom capacitive plate, and a second mask and RIE step is used to pattern the capacitor dielectric. A top capacitive plate material is deposited over the capacitor dielectric, and a third mask and RIE step is used to form the top capacitive plate. Each mask and RIE step adds labor and cost to the MIM capacitor fabrication process.

SUMMARY OF THE INVENTION

Embodiments of the present invention achieve technical advantages as a method of forming MIM capacitor structures that requires only one mask. The method includes a process for fabricating MIM capacitors embedded in dual-damascene BEOL structures with high capacitance density. A single horizontal MIM capacitor or a plurality of parallel horizontal MIM capacitors may be fabricated in a dual damascene structure in accordance with embodiments of the invention.

In accordance with a preferred embodiment of the present invention, a method of forming a MIM capacitor includes providing a workpiece, depositing an inter-level dielectric (ILD) layer over the workpiece, and forming a first pattern in the ILD layer, wherein the first pattern has a first depth within the ILD layer. A second pattern is formed in the ILD layer, the second pattern having a second depth within the ILD layer. The second depth is greater than the first depth. A first conductive layer is disposed over the first pattern of the ILD layer. A second conductive layer is disposed over the second pattern of the ILD layer, and a first dielectric layer is disposed over at least the second conductive layer. A third conductive layer is disposed over the first dielectric layer. The second conductive layer, first dielectric layer and third conductive layer over the second pattern form a first MIM capacitor.

In accordance with another preferred embodiment of the present invention, a MIM capacitor includes a workpiece and an ILD layer deposited over the workpiece. The ILD layer includes a first pattern having a first depth and a second pattern having a second depth, with the second depth being greater than the first depth. A first conductive layer is disposed over the first pattern of the ILD layer. A second conductive layer is disposed over the second pattern of the ILD layer, a first dielectric layer is disposed over the second conductive layer, and a third conductive layer is disposed over the first dielectric layer. The second conductive layer, first dielectric layer and third conductive layer over the ILD layer second pattern form a first MIM capacitor.

Advantages of embodiments of the invention include providing a simplified process for forming a MIM capacitor in a semiconductor device. The two-depth structure of a dual damascene process is utilized, forming a MIM capacitor in the deeper via portion of the ILD layer, while conductive lines are simultaneously formed in the shallower metallization layer. Only one mask is required to form a single MIM capacitor or multiple parallel MIM capacitors, resulting in production time, cost and labor savings. A planarization step is used to form the MIM capacitor structure within the MIM capacitor pattern of the ILD or dielectric layer. Parallel MIM capacitors may be connected in parallel, increasing the capacitance of the MIM capacitor structure.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

Preferred embodiments of the present invention will be described, followed by a discussion of some advantages thereof. Only one MIM capacitor structure is shown in each figure, although many MIM capacitor structures and conductive lines may be present within each layer. Dielectric and conductive material layers are generally numbered (e.g., first, second, third) in order of introduction in the description for convenience; the numbering does not indicate a preferred order of deposition, processing, or removal, for example.

Figure 1:
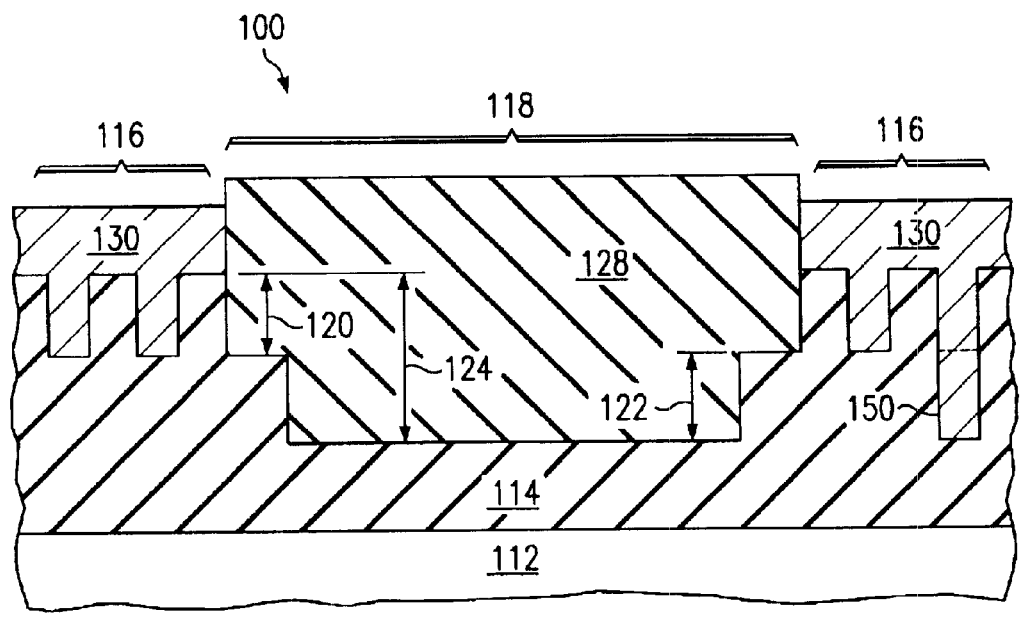
FIGS. 1–3 show cross-sectional views of an embodiment of the invention at various manufacturing stages, wherein a single horizontal MIM capacitor is formed in a dual damascene pattern of an ILD layer.
Figure 2:
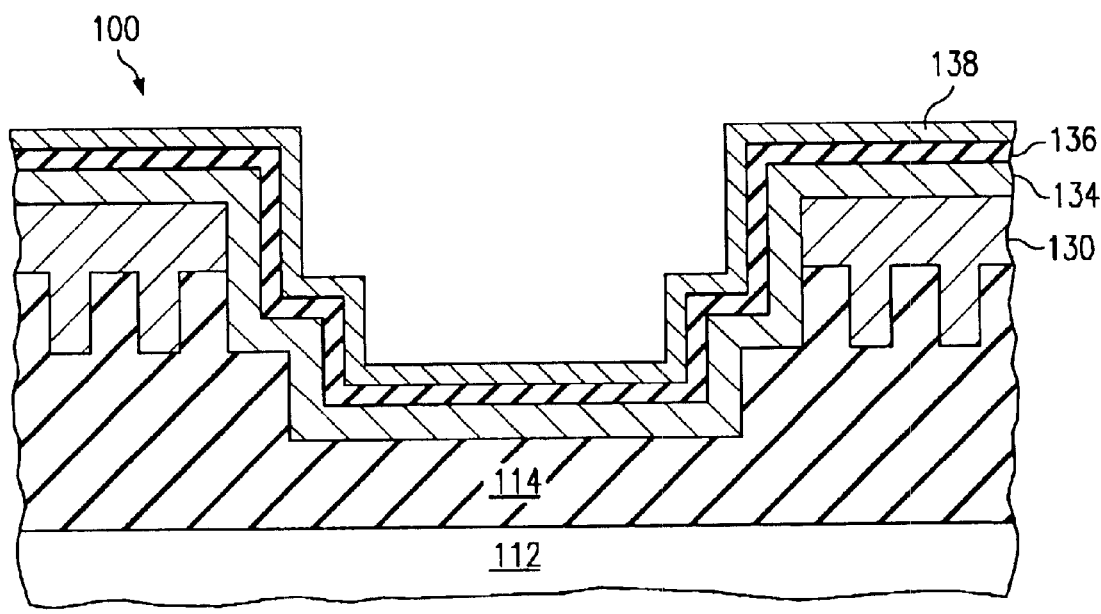
Figure 3:
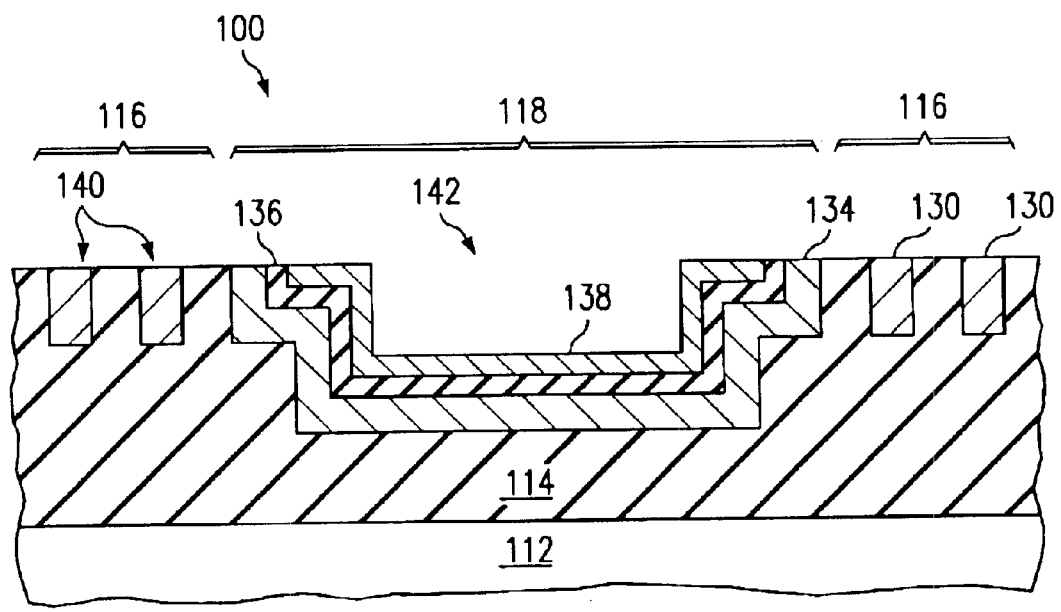

FIGS. 1–3 show cross-sectional views of a semiconductor device 100 including a MIM capacitor at various manufacturing stages, in accordance with a first embodiment of the present invention. Referring to FIG. 1, a workpiece 112 is provided. The workpiece 112 preferably comprises silicon oxide or any low-K dielectric over, and possibly abutting, single-crystal silicon. The workpiece 112 may include other conductive layers or other semiconductor elements, e.g. transistors, diodes, etc. Compound semiconductors such as GaAs, InP, Si/Ge, or SiC may alternatively be used in place of silicon, as examples.

A dielectric layer 114 is deposited over the workpiece 112. The dielectric layer 114 preferably comprises an ILD layer comprising a high dielectric constant, such as silicon nitride, tantalum oxide or barium strontium titanate oxide (BSTO). Alternatively, the dielectric layer 114 may comprise silicon oxynitride, silicon dioxide or a low-dielectric constant material, having a dielectric constant k of 3.6 or less, for example. If a low-k material is used, it may be spun-on and then exposed to a heating step (baked) of about 400 degrees C. to remove the solvents, for example. Alternatively, a low-k material may be deposited using a chemical vapor deposition (CVD) process.

The dielectric layer 114 is patterned and etched to form areas or trenches that define at least one first pattern 116 for a plurality of conductive lines and at least one second pattern 118 for a MIM capacitor. Preferably, a lithography and an etch process such as a RIE is used to define the conductive line pattern 116, and a separate lithography and etch process such as a RIE is used to define the vias, in a dual-damascene process. The separate lithography and etch process is also used to define the MIM capacitor pattern 118. The first pattern 116 extends to a first depth 120 within the ILD layer 114, and the second pattern 118 extends to a second depth 124 within the ILD layer 114. Preferably, the second depth 124 is greater than the first depth 120 and is equal to the conductive line depth 120 plus the via layer depth 122. The deeper pattern 118 is preferably patterned before the shallower pattern 116 is patterned, although alternatively, the shallower pattern 116 may be patterned first, for example.

The depth 124 of the MIM capacitor pattern 118 in one embodiment preferably comprises the depth 120 of metal wiring plus the depth 122, which is the same as the depth of via 150 shown in FIG. 1. The via 150 may, for example, extend the entire depth of the ILD layer 114 (not shown in FIG. 1; see via 350 of FIG. 10). The pattern 116 for the conductive lines preferably comprises the first depth 120 required for the conductive lines.

The MIM capacitor pattern 118 trenches typically are approximately 0.2 to 1 micrometers deep, and may be in the shape of a circle, rectangle, or square, for example. The width of the trenches varies with the desired capacitance of the MIM capacitor and typically ranges from 2–3 square $\mu$m up to about 100 square $\mu$m. The larger the area of the MIM capacitor, the higher the capacitance.

A photoresist 128 is deposited or formed over the dielectric layer 114 over the entire surface of the device 100. The photoresist 128 may comprise a positive or negative resist, and preferably comprises a photosensitive polymer that may be spun-on, for example. Alternatively, the photoresist 128 may comprise other resists, for example.

The photoresist 128 is patterned using lithographic techniques to leave the photoresist 128 over the MIM capacitor pattern 118 and open the conductive line pattern 116. With the photoresist 128 covering and protecting the MIM capacitor pattern 118 region of the dielectric layer 114, a conductive material 130 is deposited or formed over the dielectric layer 114 in the conductive line pattern 116 region. The conductive material 130 is also referred to herein as a first conductive layer. The conductive material 130 may comprise a copper alloy such as copper combined with magnesium, aluminum, indium or a combination thereof, for example. The conductive material 130 may alternatively comprise other metals such as aluminum, as an example. The first conductive layer 130 may be applied using CVD, as an example, although other deposition techniques may be used.

The photoresist 128 is stripped from the MIM capacitor pattern 118 region, as shown in FIG. 2, and the surface of the dielectric layer 114 is cleaned. A conductive layer 134 is deposited over the dielectric layer 114 in the MIM capacitor pattern 118 region and over the first conductive layer 130 in the conductive line pattern 116 region. The conductive layer 134 is also referred to herein as a second conductive layer. The second conductive layer 134 preferably comprises a conductive material such as W, Ti, TiW, TiN, Ta, TaN, Al, Cu or other conducting materials, or combinations thereof, as examples. The second conductive layer 134 may be formed over the dielectric layer 114 using CVD, physical vapor deposition (PVD), evaporation, plating or a combination thereof, as examples. The second conductive layer 134 preferably comprises a thickness of approximately 500 Å to 4000 Å, for example.

A dielectric layer 136 is deposited over the second conductive layer 134. The dielectric layer 136 is also referred to herein as a first dielectric layer. The first dielectric layer 136 preferably comprises silicon oxide, silicon nitride, $Ta_2O_3$, aluminum oxide, strontium titanate, BSTO, a combination thereof, or other dielectric materials, as examples. The first dielectric layer 136 may be deposited by CVD, PVD or a spin-on method, as examples. The first dielectric layer 136 preferably comprises a thickness ranging from 200 Å to 2000 Å, as examples. Follow-up processes such as cure, plasma treatment, and anneal of the dielectric layer 136 are made if needed.

A conductive layer 138 is deposited over the first dielectric layer 136. The conductive layer 138 is also referred to herein as a third conductive layer. The third conductive layer 138 may comprise a conductive material such as W, Ti, TiW, TiN, Ta, TaN, Al, Cu, other metals, or/and a combination thereof, as examples. The third conductive layer 138 may be deposited by CVD, PVD, evaporation, plating or a combination thereof, as examples. The thickness of the third conductive layer 138 preferably ranges from 200 Å to 4000 Å, as examples.

A planarization process such as a chemical-mechanical polish (CMP) process is performed on the surface of the wafer 100 to remove the excess material layers 130, 134, 136 and 138 from over the dielectric layer 114 top surface, as shown in FIG. 3. The CMP process is preferably adapted to stop on the ILD dielectric layer 114. The planarization process results in the formation of a horizontal (e.g. along the length of the wafer) MIM capacitor 142 having a top plate (third conductive layer 138), capacitor dielectric (first dielectric layer 136) and a bottom plate (second conductive layer 134). Vias from underlying and overlying subsequently deposited layers may be coupled to the top and bottom MIM capacitor plates 138/134 to electrically connect to the plates (not shown in FIG. 3; see FIGS. 10, 11 and 13). During the planarization process, conductive lines 140 are formed in the conductive line pattern 116 region simultaneously with the formation of the MIM capacitor 142, by the removal of the first conductive layer 130 from the surface of the dielectric layer 114.

Figure 6:
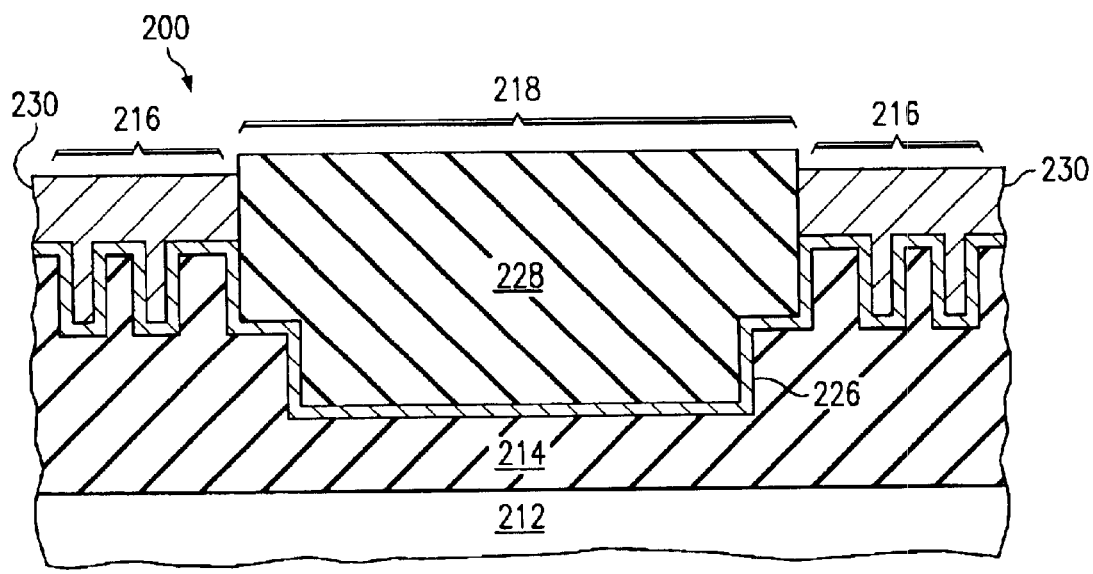
Figure 7:
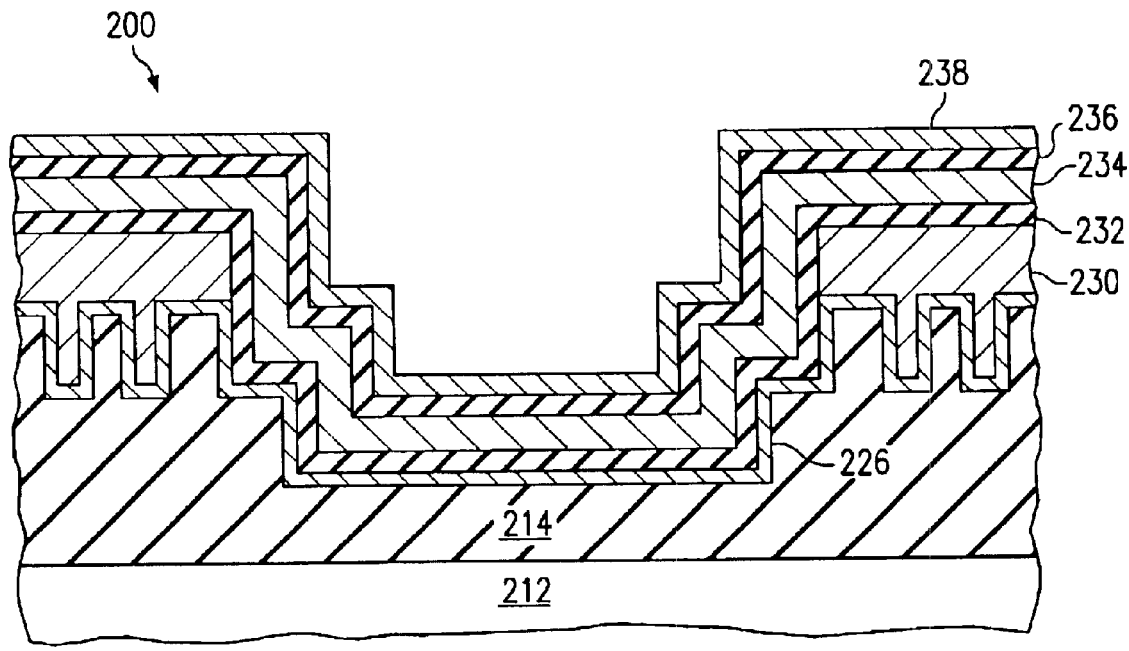
Figure 8:
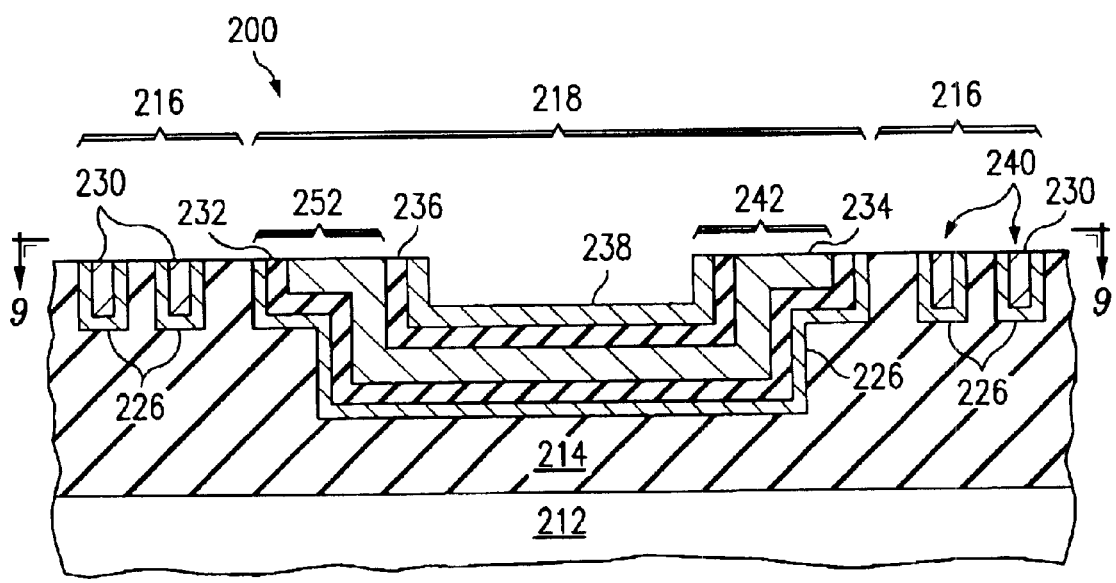

FIGS. 4–8 show cross-sectional views of an embodiment of the invention at various manufacturing stages, in which a semiconductor device 200 includes-two parallel horizontal MIM capacitors 242/252 formed in a dual damascene pattern of an ILD layer 214 (see FIG. 8). Similar processes and materials are used to manufacture the structure shown in FIGS. 4–8 as described herein for FIGS. 1–3.

Figure 4:
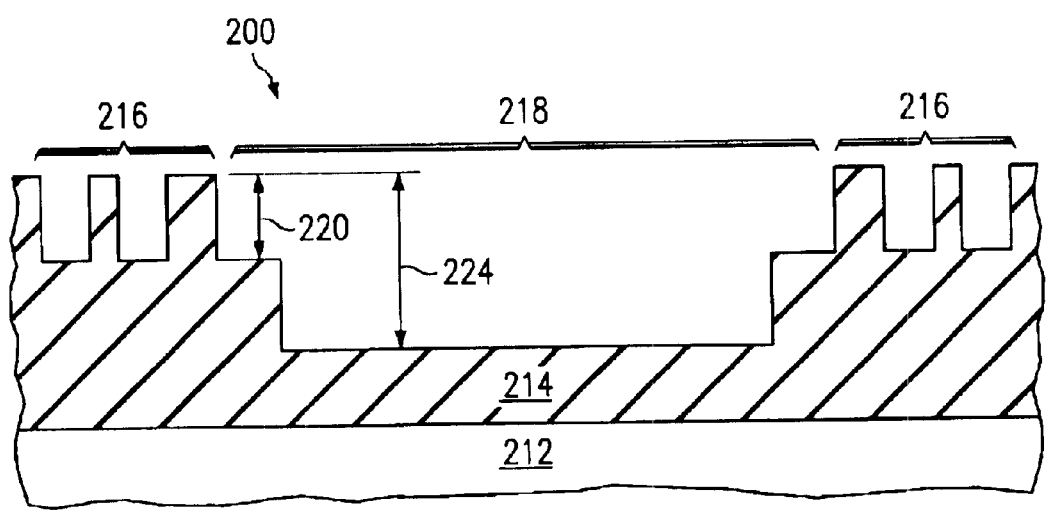
FIGS. 4–8 show cross-sectional views of an embodiment of the invention at various manufacturing stages, in which two or more parallel horizontal MIM capacitors are formed in a dual damascene pattern of an ILD layer.

Referring to FIG. 4, a workpiece 212 is provided, and a dielectric layer 214 is formed over the workpiece 212. The dielectric layer 214 is patterned and etched to form areas or trenches that define a first pattern 216 for a plurality of conductive lines and a second pattern 218 for a MIM capacitor. The patterns 216/218 are preferably formed in a dual damascene process, wherein pattern 218 has a greater depth 224 than the depth 220 of pattern 216.

Figure 5:
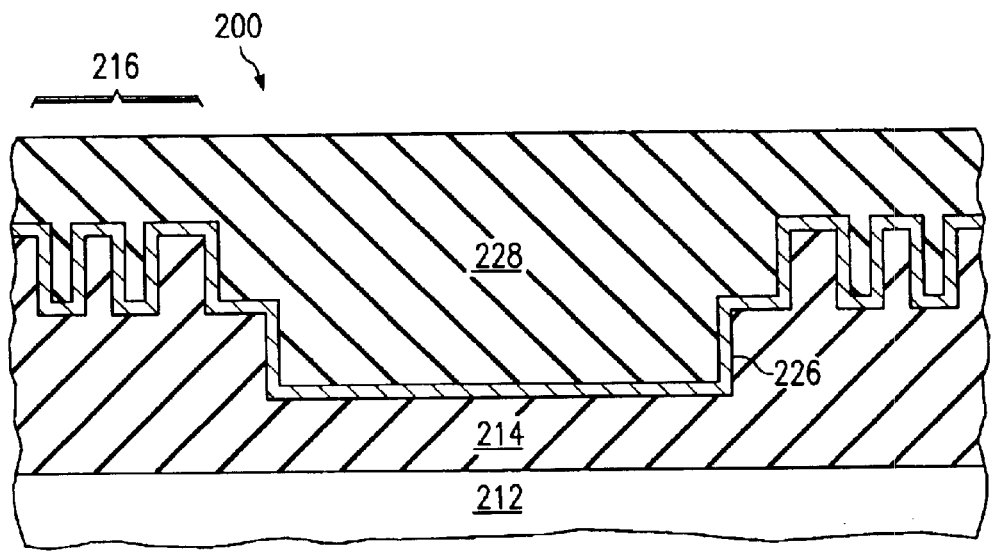

In this embodiment, before depositing a photoresist 228, a conductive liner 226 is deposited over the dielectric 214, as shown in FIG. 5. The conductive liner 226 is also referred to herein as a fourth conductive layer and a bottom plate. The conductive liner 226 may be formed by PVD or CVD, for example. The conductive liner 226 is preferably about 250 to 2000 Å thick, for example. The conductive liner 226 preferably comprises a thickness such that the electrical resistance is low enough that the liner 226 can be used as a MIM capacitive plate, and also function as a good diffusion barrier.

The conductive liner 226 preferably comprises a barrier layer of TaN, TiN, Ta, W, or a combination thereof, and alternatively comprises other suitable liner materials that will prevent conductive materials such as copper (such as conductive material 230; see FIG. 6) from diffusing through the dielectric 214 or workpiece 212, for example. The barrier layer of the conductive liner 226 may also comprise a stack of various materials.

The conductive liner 226 may also include an optional seed layer deposited over the barrier layer by PVD or CVD, for example. The seed layer of the conductive liner 226 preferably comprises a copper alloy such as copper combined with magnesium, aluminum, indium or a combination thereof. The seed layer may alternatively comprise other metals.

A photoresist 228 is deposited or formed over the conductive liner 226, as shown in FIG. 5. The photoresist 228 is patterned using lithography to leave the photoresist 228 over the MIM capacitor pattern 218 and open the conductive line pattern 216, as shown in FIG. 6. A first conductive material 230 is deposited or formed over the conductive liner 226 in the conductive line pattern 216 region. Preferably, when the first conductive material 230 comprises copper, the first conductive material 230 is electroplated over the wafer 200 where photoresist 228 does not reside, using a copper seed layer of the conductive liner 226 in a plate-through mask technique, to obtain optimal fill in the trenches. The first conductive material 230 preferably comprises substantially pure bulk copper deposited over the conductive liner 226 seed layer, or over the conductive liner 226 barrier layer, when a seed layer is not used. Although optional, the use of a top seed layer in the conductive liner 226 is preferred, because the seed layer permits an electroplating wet-line process in which a current is placed on the wafer in a galvanic deposition process. Alternatively, the first conductive layer 230 may comprise other metals applied using CVD, for example.

The photoresist 228 is stripped from over the conductive liner 226 in the MIM capacitor pattern 218 of the dielectric layer 214, as shown in FIG. 7, and the surface of the conductive liner 226 is cleaned. A dielectric layer 232 is deposited over the exposed portions of the conductive liner 226 in the MIM capacitor pattern 218 and the conductive material 230 in the conductive line pattern 216. The dielectric layer 232 is also referred to herein as a second dielectric layer. The second dielectric layer 232 preferably comprises silicon oxide, silicon nitride, $Ta_2O_5$, aluminum oxide, strontium titanate, BSTO, a combination thereof or other dielectric materials, as examples. The second dielectric layer 232 may be deposited by CVD, PVD or a spin-on method, as examples. The second dielectric layer 232 preferably comprises a thickness ranging from 200 Å to 2000 Å, for example. Follow-up processes such as cure, plasma treatment, and anneal of the dielectric 232 are made if needed.

Processing of the semiconductor device 200 is continued as described for the embodiment shown in FIGS. 1–3. A second conductive layer 234 is deposited over the second dielectric layer 232 in at least the MIM capacitor pattern 218 region. The second conductive layer 234 is also referred to herein as a middle plate. Preferably, the second conductive layer 234 is also deposited over the first conductive layer 230 in the conductive line pattern 216 region, as shown. A first dielectric layer 236 is deposited over the second conductive layer 234, and a third conductive layer 238 is deposited over the first dielectric layer 236. The third conductive layer 238 is also referred to herein as a top plate.

A planarization process such as a chemical-mechanical polish (CMP) process is performed on the surface of the wafer 200 to remove portions of the excess material of layers 226, 230, 232, 234, 236 and 238 from over the dielectric layer 214 top surface, as shown in FIG. 8. The CMP process is preferably adapted to stop on the ILD dielectric layer 214.

The planarization process results in the formation of two horizontal MIM capacitors 242 and 252. A first MIM capacitor 242 includes a top plate (third conductive layer 238), a capacitor dielectric (first dielectric layer 236) and a middle plate (second conductive layer 234). A second MIM capacitor 252 includes the middle plate (second conductive layer 234), a capacitor dielectric (second dielectric layer 232) and a bottom plate (fourth conductive layer or conductive liner 226). During the planarization process, conductive lines 240

(which comprise fourth conductive layer 226 and the first conductive layer 230 in the conductive line pattern 216) are also formed in the conductive line pattern 216 region by the removal of the first conductive layer 230 and fourth conductive layer 226 from the top surface of the dielectric layer 214.

Figure 9:
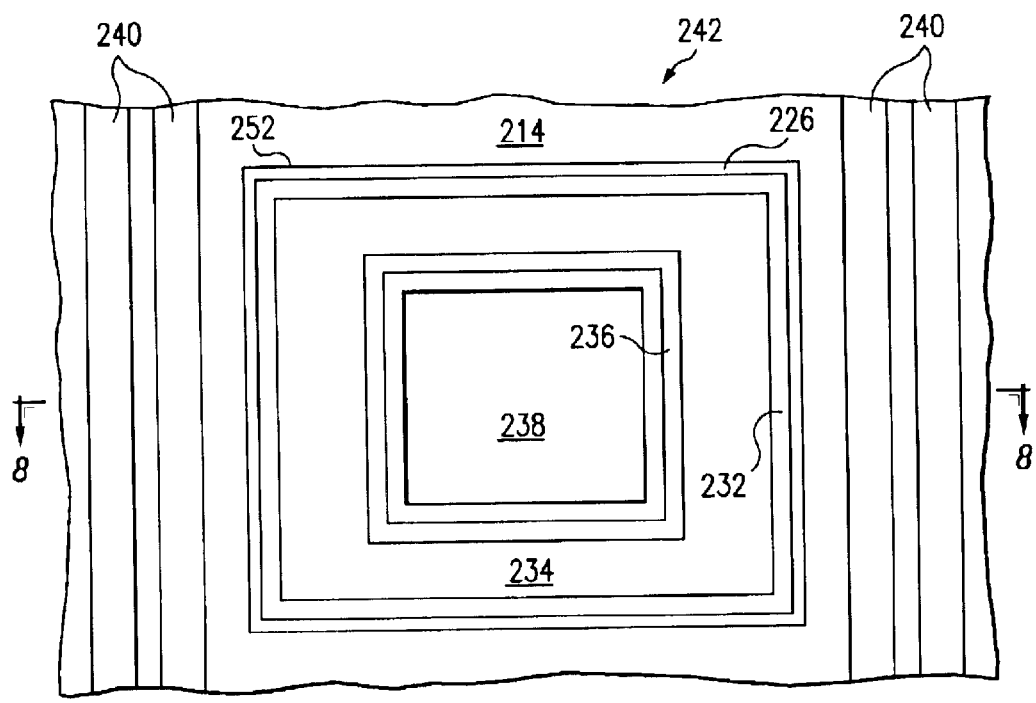
FIG. 9 shows a top view of the device shown in FIG. 8.

Advantageously, in accordance with embodiments of the present invention, the patterned MIM capacitor region 218 is protected by photoresist 228 while the conductive material for conductive lines 240 is deposited. Then, the various dielectric and conductive layers 232, 234, 236 and 238 are deposited over the exposed MIM capacitor pattern 218 and over the conductive lines 240. Upon the removal of excess material from the top surface of the dielectric layer 214, conductive lines 240 and parallel MIM capacitors 242 and 252 are simultaneously formed within the dielectric layer 214. The conductive liner 226 functions as the bottom plate of the lower MIM capacitor 252. The novel semiconductor device 200 includes two parallel MIM capacitors 242/252 formed in the horizontal direction of the wafer. A top view of the parallel MIM capacitors 242 and 252 of FIG. 8 at line 9—9 is shown in FIG. 9.

Subsequent processing steps are then performed on the semiconductor device 200. Dielectric layers may be deposited over the top surface of the MIM capacitors 242/252. Other metallization layers may be formed, with vias being formed to connect upper level metallization layers to the top plate 238, middle plate 232 and bottom plate 226 of the MIM capacitors 242/252 (see FIGS. 11 and 13). Vias may be formed within the workpiece 212 to underlying conductive lines to connect to the bottom plate 226, for example (see FIG. 10).

While only two parallel MIM capacitors are shown in FIG. 8, embodiments of the present invention can be utilized to fabricate three or more parallel MIM capacitors in a dual damascene structure by the deposition of additional dielectric and conductive layers over the third conductive material or top plate 238 prior to planarizing the device 200.

Figure 10:
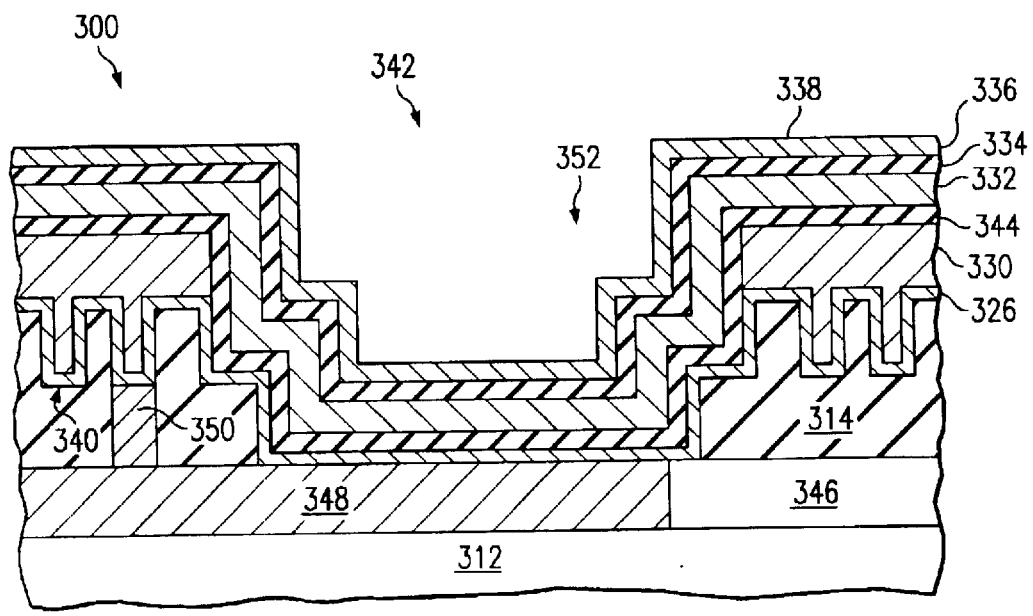
FIG. 10 shows a cross-sectional view of an embodiment of the invention wherein a cap layer is disposed over the bottom capacitive plate in the MIM capacitor pattern.

In the embodiment shown in FIG. 8, the conductive liner 226 in the MIM capacitor pattern 218 region functions as a MIM capacitor 252 bottom plate. However, in an alternate embodiment, one or more additional layers 344 may be deposited over the conductive liner 226, as shown in FIG. 10. In this embodiment of the invention, a cap layer 344 is formed or deposited over the conductive liner 326 prior to the deposition of second dielectric layer 332. This is advantageous if the process of depositing the second dielectric 332 may cause a chemical reaction with an underlying material, such as copper, in the conductive liner 326. The cap layer 344 may comprise a conductive cap layer or a dielectric cap layer deposited prior to the dielectric 332 deposition, to protect the liner 326 material from reaction. Conductive and dielectric layers 332, 334, 336 and 338 are then deposited over the cap layer 344 as described for the embodiment shown in FIGS. 4–8. The device 300 is then processed using a CMP process to planarize the wafer at the ILD layer 314 surface, forming conductive lines 340 and parallel MIM capacitors 342/352.

Alternatively, if the conductive liner 326 is too thin and has too high a resistance to act as a capacitive plate, then the cap layer 344 may comprise an additional layer of conductive material disposed over the conductive liner 326 so that the capacitive bottom plate comprises a sufficient thickness to function as a capacitive plate.

The bottom metal plate 326 may be connected through wiring to the metal lines at the same metal level or through the via layer to an underlying metal layer 348 in a lower ILD layer 346, as shown in FIG. 10. Preferably, the middle plate 234/334 and top metal plates 238/338 are connected through vias to metallization levels in subsequently-deposited metallization layers (not shown in FIG. 10; see FIGS. 11 and 13).

Figure 11:
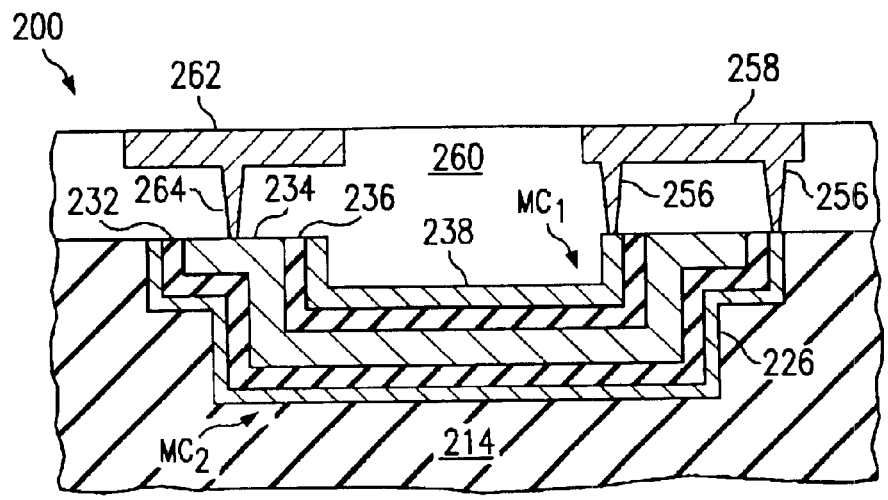
FIG. 11 shows a cross-sectional view of an embodiment wherein two MIM capacitors are coupled in parallel by subsequently formed overlying vias and conductive lines.

Referring again to FIG. 8, in accordance with embodiments of the present invention, two or more horizontal MIM capacitors 242/252 may be manufactured in a dual damascene process, with each additional MIM capacitor 252 residing over a MIM capacitor 242 that shares a common capacitive plate 234 (FIG. 11). The plurality of MIM capacitors 242/252 may be coupled together in parallel or in series.

Figure 12:
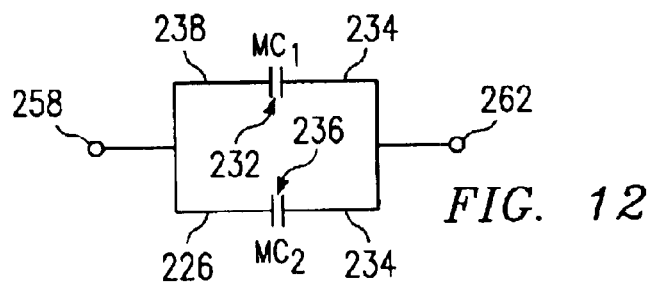
FIG. 12 is a schematic of the embodiment shown in FIG. 11.

FIG. 11 shows a cross-sectional view of an embodiment of the invention wherein a first MIM capacitor MC1 is coupled in parallel to a second MIM capacitor MC2 by subsequently formed wiring. A schematic of the embodiment of FIG. 11 is shown in FIG. 12. A first MIM capacitor MC1 comprises top plate 238, capacitor dielectric 236 and middle plate 234. A second MIM capacitor MC2 comprises middle plate 234, capacitor dielectric 236 and bottom plate 226. Two vias 256 are coupled to the MC1 top plate 238 and the MC2 bottom plate 226. The vias 256 are coupled to a conductive line 258. The middle plate 234 of MIM capacitors MC1 and MC2 is coupled by via 264 to a conductive line 262. The vias 256 and 264 and conductive lines 258 and 262 may reside within a dielectric layer 260, for example.

The structure shown in FIG. 11 is exemplary of a method of connecting MIM capacitors MC1 and MC2 in parallel, as shown in FIG. 12. The total capacitance $C_{tot}$ of parallel MIM capacitors MC1 and MC2 may be expressed by Equation 1:

$$C_{tot}=C_{MC1}+C_{MC2} \qquad \text{Eq. 1:}$$

Thus, if the capacitance of MC1 is approximately equal to the capacitance of MC2, the capacitance of the MIM capacitor structure is doubled by coupling the two MIM capacitors MC1 and MC2 in parallel.

Figure 13:
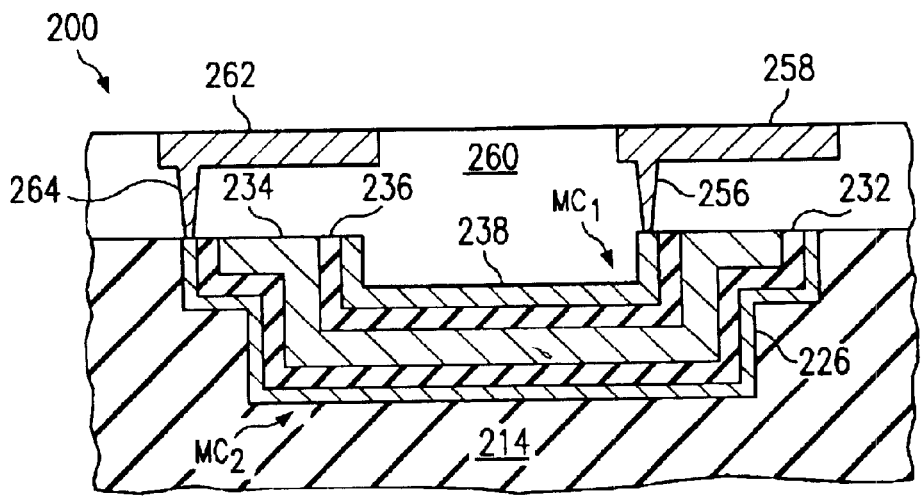
FIG. 13 shows a cross-sectional view of an embodiment wherein two MIM capacitors are coupled in series.
Figure 14:
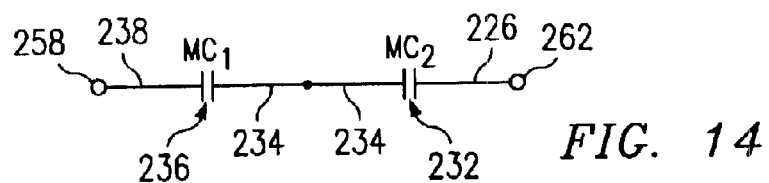
FIG. 14 is a schematic of the embodiment shown in FIG. 13.

Alternatively, the MIM capacitors MC1 and MC2 may be coupled to subsequently formed wiring and treated as two capacitors connected series, as shown in FIGS. 13 and 14. Because the MIM capacitors MC1 and MC2 share a common plate 234, they are coupled in series by the nature of their structure. The total capacitance $C_{tot}$ of the series embodiment may be represented by Equation 2:

$$1/C_{tot}=1/C_{MC1}+1/C_{MC2} \qquad \text{Eq. 2:}$$

Embodiments of the present invention achieve technical advantages as a method of manufacturing MIM capacitors in a BEOL, requiring few additional processing steps, such as a lithographic level with large ground rule ($\mu$ms), and a few deposition steps. The parallel MIM capacitor 242/252 structure results in a MIM capacitor having an increased capacitance. Coupling two or more horizontal MIM capacitors 242/252 having a parallel structure in accordance with embodiments of the invention results in a MIM capacitor 242/252 having an increased the capacitance than prior art MIM capacitors having similar surface areas, for example. The manufacturing process of a MIM capacitor is simplified by use of embodiments of the present invention. Only one mask (e.g. the mask used for form the MIM capacitor pattern 116/216) is required to form the single or plurality of parallel MIM capacitors described herein, resulting in cost, time and labor savings.

Embodiments of the invention may be implemented in a via level, as shown in FIGS. 11 and 13, or in both a via level and a conductive line metallization layer, as shown in FIGS. 1–8 and 10, for example.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of forming a metal-insulator-metal (MIM) capacitor, comprising:
   providing a workpiece;
   depositing an inter-level dielectric ILD layer over the workpiece;
   forming a first pattern in the ILD layer;
   forming a second pattern in the ILD layer; and then
   depositing and patterning a layer of photoresist such that said first pattern is exposed and said second pattern is covered;
   disposing a first conductive layer over the first pattern of the ILD layer; and then
   removing said patterned layer of photoresist to expose said second pattern;
   disposing a second conductive layer over the exposed second pattern of the ILD layer;
   disposing a first dielectric layer over at least the second conductive layer; and
   disposing a third conductive layer over the first dielectric layer, wherein the second conductive layer, first dielectric layer and third conductive layer over the second pattern form a first MIM capacitor.

2. The method according to claim 1, wherein forming a first pattern comprises forming a pattern for a plurality of conductive lines in a metallization layer.

3. The method according to claim 2, wherein forming a second pattern comprises forming a MIM capacitor pattern.

4. The method according to claim 2 wherein forming said first pattern further comprises forming at least one via beneath one of said conductive lines.

5. The method according to claim 4, wherein forming said at least one via beneath one of said conductive lines and disposing a first conductive layer comprises dual damascene process.

6. The method according to claim 1, wherein disposing the second conductive layer comprises also disposing the second conductive layer over the first pattern, wherein disposing the first dielectric layer comprises disposing the first dielectric layer over the first pattern, and disposing a third conductive layer comprises disposing the third conductive layer over the first pattern.

7. The method according to claim 6, further comprising removing the first conductive layer, second conductive layer, first dielectric layer, and third conductive layer from above a top surface of the ILD layer using a chemical mechanical polish (CMP) process.

8. The method according to claim 6, further comprising:
   disposing a fourth conductive layer over the ILD layer, before forming a photoresist over the ILD layer; and
   disposing a second dielectric layer over at least the second pattern of the ILD layer, before depositing the first conductive layer, wherein the fourth conductive layer, second dielectric layer and first conductive layer over the second pattern form a second MIM capacitor.

9. The method according to claim 8, further comprising removing the fourth conductive layer, second dielectric layer, first conductive layer, second conductive layer, first dielectric layer, and third conductive layer from above a top surface of the ILD layer using a chemical mechanical polish (CMP) process.

10. The method according to claim 1 wherein said second pattern has a depth greater than said first pattern.

11. The method according to claim 1 wherein said step of forming a first pattern comprises forming said first pattern in first selected areas and forming a second pattern comprises forming said second pattern in second selected areas that are difference areas than said first selected areas.

12. The method according to claim 11 wherein said first conductive layer disposed over the first pattern of the ILD layer is not disposed over the second pattern of the ILD layer.

13. The method according to claim 12 wherein said step of depositing an inter-level dielectric (ILD) layer comprises the step of depositing a single material inter-level dielectric, said single material layer selected from the group consisting of silicon nitride, tantalum oxide, barium strontium titanate oxide, silicon oxynitride, silicon dioxide and a low-dielectric constant material having a dielectric constant "k" no greater than 3.6.

14. The method according to claim 11 wherein said step of depositing an inter-level dielectric (ILD) layer comprises the step of depositing a single material inter-level dielectric, said single material layer selected from the group consisting of silicon nitride, tantalum oxide, barium strontium titanate oxide, silicon oxynitride, silicon dioxide and a law-dielectric constant material having a dielectric constant "k" no greater than 3.6.

15. The method according to claim 1 wherein said first conductive layer disposed over the first pattern of the ILD layer is not disposed over the second pattern of the ILD layer.

16. The method according to claim 15 wherein said step of depositing an inter-level dielectric (ILD) layer comprises the step of depositing a single material inter-level dielectric, said single material layer selected from the group consisting of silicon nitride, tantalum oxide, barium strontium titanate oxide, silicon oxynitride, silicon dioxide and a low-dielectric constant material having a dielectric constant "k" no greater than 3.6.

17. The method according to claim 1 wherein said step of depositing an inter-level dielectric (ILD) layer comprises the step of depositing a single material inter-level dielectric, said single material layer selected from the group consisting of silicon nitride, tantalum oxide, barium strontium titanate oxide, silicon oxynitride, silicon dioxide and a low-dielectric constant material having a dielectric constant "k" no greater than 3.6.

18. A method of forming metal-insulator-metal (MIM) capacitors, comprising:
   providing a workpiece;
   depositing an inter-level dielectric (ILD) layer over the workpiece;
   forming a first pattern in the ILD layer;

forming a second pattern in the ILD layer;
disposing a first conductive layer over the patterned ILD layer;
forming a photoresist over the first conductive layer;
removing portions of the photoresist to expose the first pattern in the ILD layer;
depositing a second conductive layer over the first pattern of the ILD layer;
removing the remaining photoresist to expose the conductive layer covering the second pattern in the ILD layer;
disposing a first dielectric layer over at least the exposed second pattern in the ILD layer;
disposing a third conductive layer over the first dielectric covering the exposed second pattern in the ILD layer;
disposing a second dielectric layer over at least the third conductive layer; and
disposing a fourth conductive layer over the second dielectric layer, wherein the third conductive layer, second dielectric layer and fourth conductive layer over the second pattern form a first MIM capacitor, and wherein the first conductive layer, first dielectric layer and third conductive layer over the second pattern form a second MIM capacitor.

19. The method according to claim 18, further comprising removing the fourth conductive layer, second dielectric layer, first conductive layer, second conductive layer, first dielectric layer, and third conductive layer from above a top surface of the ILD layer using a chemical mechanical polish (CMP) process.

20. The method according to claim 18, wherein the first conductive layer composes a conductive barrier liner.

21. The method according to claim 20, wherein the first conductive layer further comprises a seed layer, wherein disposing a second conductive layer comprises electroplating the second conductive layer over the seed layer.

22. The method according to claim 18, further comprising coupling the first conductive layer to the fourth conductive layer so that the first MIM capacitor and the second MIM capacitor are connected in parallel.

23. The method according to claim 18, wherein forming a first pattern comprises forming a pattern for a plurality of conductive lines in a metallization layer.

24. The method according to claim 23, wherein forming a second pattern comprises forming a MIM capacitor pattern.

25. The method according to claim 23, wherein forming said first pattern further comprises forming at least one via beneath one of said conductive lines.

26. The method according to claim 25, wherein forming said at least one via beneath one of said conductive lines and disposing a first conductive layer comprises a dual damascene process.

27. A method of forming a metal-insulator-metal (MIM) capacitor, comprising:
providing a workpiece;
depositing an inter-level dielectric (ILD) layer over the workpiece;
defining a first pattern in first selected areas of the ILD layer;
defining a second pattern in second selected areas of the ILD layer, said second selected areas of the ILD layer different than said first selected areas;
disposing a first conductive layer over the first pattern of the ILD layer, but not over the second pattern of the ILD layer;
disposing a second conductive layer over the second pattern of the ILD layer;
disposing a first dielectric layer over at least the second conductive layer; and
disposing a third conductive layer over the first dielectric layer, wherein the second conductive layer, first dielectric layer and third conductive layer over the second pattern form a first MIM capacitor.

28. The method according to claim 27 wherein said step of depositing an inter-level dielectric (ILD) layer comprises the step of depositing a single material inter-level dielectric, said single material layer selected from the group consisting of silicon nitride, tantalum oxide, barium strontium titanate oxide, silicon oxynitride, silicon dioxide and a low-dielectric constant material having a dielectric constant "k" no greater than 3.6.

29. A method of forming a metal-insulator-metal (MIM) capacitor, comprising:
providing a workpiece;
depositing a single inter-level dielectric (ILD) layer over the workpiece, said single material layer selected from the group consisting of silicon nitride, tantalum oxide, barium strontium titanate oxide, silicon oxynitride, silicon dioxide and a low-dielectric constant material having a dielectric constant "k" no greater than 3.6;
defining a first pattern in first selected areas of the ILD layer;
defining a second pattern in second selected areas of the ILD layer, said second selected areas of the ILD layer different than said first selected areas;
disposing a first conductive layer over the first pattern of the ILD layer;
disposing a second conductive lever over the second pattern of the ILD layer;
disposing a first dielectric layer over at least the second conductive layer; and
disposing a third conductive layer over the first dielectric layer, wherein the second conductive layer, first dielectric layer and third conductive layer over the second pattern form a first MIM capacitor.

30. A method of forming a metal-insulator-metal (MIM) capacitor, comprising:
providing a workpiece;
depositing an inter-level dielectric (ILD) layer over the workpiece;
forming a first pattern in the ILD layer;
forming a second pattern in the ILD layer
disposing a first conductive layer over the first pattern of the ILD layer, said first conductive layer not disposed over said second pattern;
disposing a second conductive layer over the second pattern of the ILD layer;
disposing a first dielectric layer over at least the second conductive layer; and
disposing a third conductive layer over the first dielectric layer, wherein the second conductive layer, first dielectric layer and third conductive layer over the second pattern form a first MIM capacitor.

31. The method according to claim 30 wherein said step of depositing an inter-level dielectric (ILD) layer comprises the step of depositing a single material inter-level dielectric, said single material layer selected from the group consisting of silicon nitride, tantalum oxide, barium strontium titanium oxide, silicon oxynitride, silicon dioxide and a low-dielectric constant material having a dielectric constant "k" no greater than 3.6.

32. A method of forming a metal-insulator-metal (MIM) capacitor, comprising:

providing a workpiece;

depositing a single material inter-level dielectric (ILD) layer over the workpiece, said single material layer selected from the group consisting of silicon nitride, tantalum oxide, barium strontium titanate oxide, silicon oxynitride, silicon dioxide and a low-dielectric constant material having a dielectric constant "k" no greater than 3.6;

forming a first pattern an the single material ILD layer;

forming a second pattern in the single material ILD layer;

disposing a first conductive layer over the first pattern of the single material ILD layer;

disposing a second conductive layer over the second pattern of the single material ILD layer;

disposing a first dielectric layer over at least the second conductive layer; and disposing a third conductive layer over the first dielectric layer, wherein the second conductive layer, first dielectric layer and third conductive layer over the second pattern form a first MIM capacitor.

* * * * *

UNITED STATES PATENT AND TRADEMARK OFFICE
CERTIFICATE OF CORRECTION

PATENT NO.    : 6,794,262 B2
DATED         : September 21, 2004
INVENTOR(S)   : Ning et al.

It is certified that error appears in the above-identified patent and that said Letters Patent is hereby corrected as shown below:

Column 13,
Line 11, delete "an" and insert -- in --.

Signed and Sealed this

Twenty-first Day of December, 2004

JON W. DUDAS
*Director of the United States Patent and Trademark Office*